(12) United States Patent
Lin et al.

(10) Patent No.: US 6,258,622 B1
(45) Date of Patent: Jul. 10, 2001

(54) FLIP CLIP BONDING LEADFRAME-TYPE PACKAGING METHOD FOR INTEGRATED CIRCUIT DEVICE AND A DEVICE FORMED BY THE PACKAGING METHOD

(75) Inventors: Albert Lin; Sam Chiang; Chong-Ren Maa, all of Hsin-Chu (TW)

(73) Assignee: Apack Technologies Inc., Hsin-Chu (TW)

( * ) Notice: Subject to any disclaimer, the term of this patent is extended or adjusted under 35 U.S.C. 154(b) by 0 days.

(21) Appl. No.: 09/327,190

(22) Filed: Jun. 7, 1999

(51) Int. Cl.[7] ................................................. H01L 21/44

(52) U.S. Cl. ........................ 438/106; 438/613; 257/666

(58) Field of Search ........................... 438/106, 121–124, 438/613; 257/666, 672, 673–675, 676, 727

(56) References Cited

U.S. PATENT DOCUMENTS

| | | | |
|---|---|---|---|
| 5,221,858 | * | 6/1993 | Higgins, III .......................... 438/123 |
| 5,917,242 | * | 6/1999 | Ball ..................................... 438/613 |

* cited by examiner

Primary Examiner—David Nelms
Assistant Examiner—Dung A Le
(74) Attorney, Agent, or Firm—Bacon & Thomas (57) ABSTRACT

A packaging method for integrated circuit device, which is fit to apply flip chip bonding technique to a leadframe-type chip carrier. The packaging method will not increase the difficulty in assembly of the integrated circuit chip with the leadframe and is able to ensure that the integrated circuit chip be assembled with the lead fingers of the leadframe without false soldering. Also, the packaging method can achieve less inductance of the transmission line and faster transmission speed. In addition, the cost required of the packaging method can be much lower than that for the organic or ceramic base board.

11 Claims, 7 Drawing Sheets

FLIP CLIP BONDING LEADFRAME-TYPE PACKAGING METHOD FOR INTEGRATED CIRCUIT DEVICE AND A DEVICE FORMED BY THE PACKAGING METHOD

BACKGROUND OF THE INVENTION

The present invention generally relates to a packaging technique for integrated circuit device, and more particularly to a flip chip bonding leadframe-type packaging method for integrated circuit device and an integrated circuit device formed by the packaging method.

In the trend of increasing density and working frequency and decreasing working voltage of integrated circuit devices, many bottlenecks exist in circuit design for placing more functions in limited chip area and meeting the requirements for faster execution speed and less interference. The bottlenecks exist because the ever decreasing line width and line pitch of the integrated circuit lead to greater interference and internal resistance that not only slows down the speed of signal transmission but also affects the completeness of the signals. Therefore, with respect to high speed integrated circuit device, under the circumstance where the internal resistance of the device cannot be reduced to increase the speed of the signal transmission, it is an inevitable trend of the electronic products to reduce the inductance of the package itself through an improved packaging technique and thus enhance the execution speed of the entire device.

Figure 1:
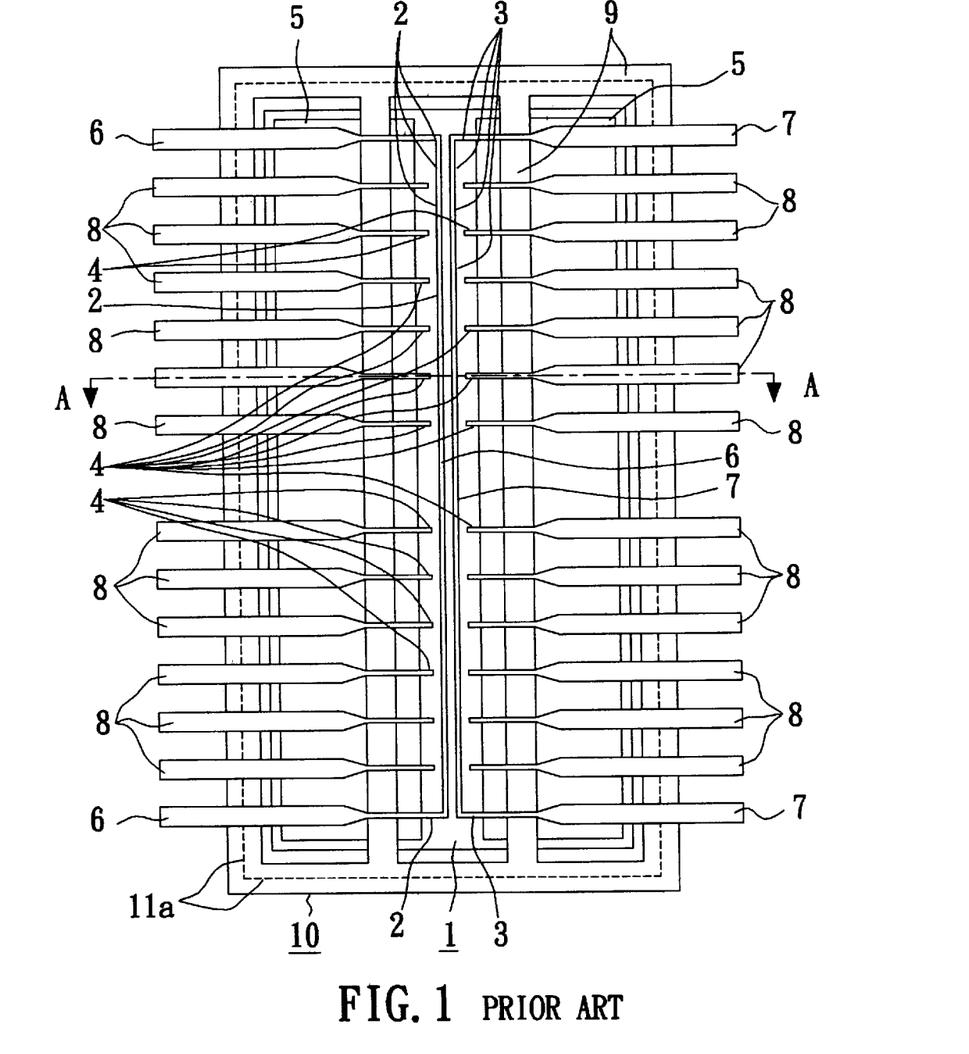
FIG. 1 is a top view of a conventional package of the integrated circuit device, in which the tape automatic bonding technique is applied to the leadframe-type chip carrier.
Figure 2:
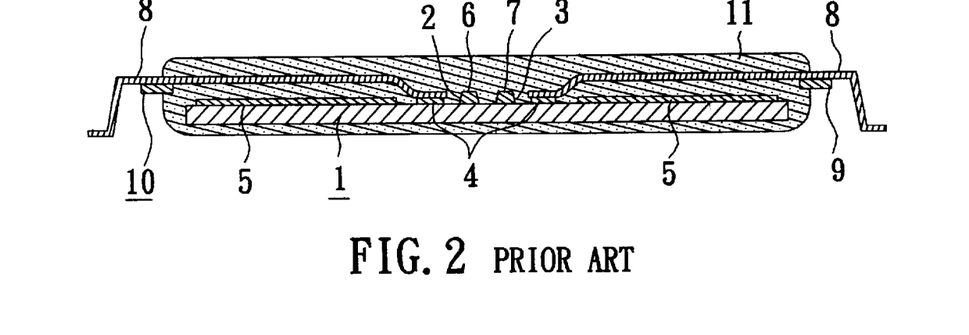
FIG. 2 is a sectional view taken along line A—A of FIG. 1.

The packaging technique of the integrated circuit mainly relates to the chip carrier and the electrical connection between the chip and the chip carrier. With respect to the chip carrying manners, they can be substantially divided into two types: leadframe and organic or ceramic base board. In the former, the long transmission distance between the inner lead fingers and outer lead fingers of the leadframe will create great inductance, which will lower the execution speed of the entire device. However, the manufacturing cost for such chip carrier is relatively low. In the latter, tin balls are used instead of the outer lead fingers of the leadframe so that the transmission distance is greatly shortened, which reduces the inductance of the package itself and thus increase the execution speed of the entire device. However, the manufacturing cost for such chip carrier is relatively high, especially in comparison with the manufacturing cost for the leadframe with low finger number. In addition, in terms of the electric connection between the chip and the chip carrier, there are generally three types of connection: wire bonding, tape automatic bonding and flip chip bonding. In the three types of electric connection, the flip chip bonding has shortest signal transmission distance so that the inductance of the transmission line thereof is least and the transmission speed thereof is fastest. In the products of the organic base board or ceramic base board type chip carriers, the electric connection measures include the above three types of bonding. However, with respect to the leadframe-type chip carrier, most of the electric connection measures employ wire bonding and only few adopt tape automatic bonding for electric connection, for example, in U.S. Pat. No. 5,252,853 as shown in FIGS. 1 and 2. It has not seen that flip chip bonding be used as the electric connection measure. In FIG. 1, the integrated circuit chip 1 has multiple ground pads 2, power pads 3 and signal pads 4. Also, the chip 1 is disposed with a polyimide film 5 for blocking α ray. The tape 10 is composed of a polyimide tape 9, ground lead 6, power lead 7 and signal leads 8. These leads are fixedly located on the polyimide tape 9, permitting the internal terminals of the leads to be directly connected with the related solder pads of the chip. FIG. 2 is a sectional view taken along line A—A of FIG. 1.

The reason that the leadframe-type chip carrier does not employ flip chip bonding as the electric connection mainly resides in that the products to which the flip chip bonding technique is applied generally have more input/output (I/O) numbers. In the case that leadframe is used as the chip carrier, the I/O must be arranged by rows rather than a matrix. Accordingly, not only the difficulty in assembly of the chip with the leadframe is increased, but also the difficulty of manufacture of the leadframe with fine pitch. In addition, the biggest problem is how to form solder-attachable top surface metallurgy (referred to as TSM hereinafter) on the leadframe, enabling the solder bumps of the chip to be fused with the leadframe and how to keep the coplanarity of the respective lead fingers of the leadframe to avoid false soldering during assembly of the chip with the lead fingers of the leadframe.

Conventionally, the lead fingers of the leadframe are sprayed with an electroplating liquid to form a metal layer for facilitating fusion of gold wires with the lead fingers during connection operation. With such metal layer in electroplating measure, the electroplating area can be hardly very small so that the range of the electroplating metal on the lead fingers will spread to and bridge two sides of the internal lead fingers. In the case that the solder bumps of the flip chip are fused with the lead fingers of the leadframe, due to the excessively large area of the TSM on the lead fingers, the molten solder will spread around. This will result in uncontrollable fusion height of the solder bumps and the lead fingers or failure of fusion. Also, in the conventional leadframe manufacturing, no matter whether an etching or a punching measure is used, the coplanarity of the lead fingers can be hardly controlled to be under 4 mils. As a result, in assembling, in the case that the height of the solder bumps is too low, false soldering may take place to lead to failure of assembly.

SUMMARY OF THE INVENTION

It is therefore a primary object of the present invention to provide an improved packaging method for integrated circuit device, which is fit to apply the flip chip bonding technique to a leadframe-type chip carrier. The packaging method will not increase the difficulty in assembly of the integrated circuit chip with the leadframe and is able to ensure that the integrated circuit chip be assembled with the lead fingers of the leadframe without false soldering. Also, the packaging method can achieve less inductance of the transmission line and faster transmission speed. In addition, the cost required of the packaging method can be much lower than that for the organic or ceramic base board.

BRIEF DESCRIPTION OF THE DRAWING

The above and other objects and advantages of the present invention can be best understood through the following description and accompanying drawings wherein.

DETAILED DESCRIPTION OF THE PREFERRED EMBODIMENTS

Figure 3:
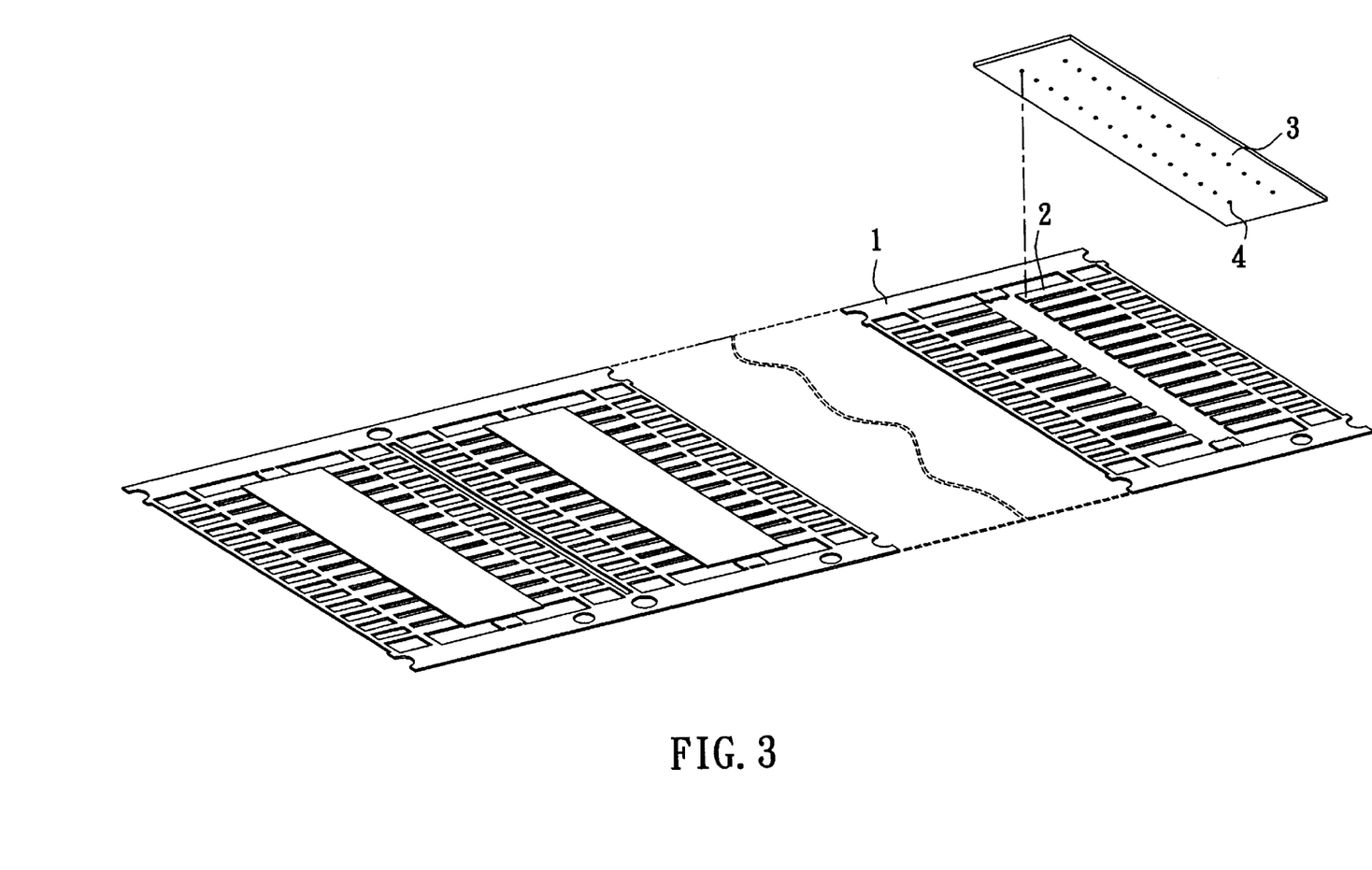
FIG. 3 is a schematic view showing the assembly of the integrated circuit chip and the leadframe according to the packaging method of the present invention.

Please refer to FIG. 3 which schematically shows the assembly of the integrated circuit chip and leadframe according to the packaging method of the present invention. The leadframe strip 1 has multiple lead fingers 2. The integrated circuit chip 3 has multiple solder bumps 4. By means of proper alignment and application of thermal pressing, the solder bumps 4 of the chip 3 are connected with the lead fingers 2 of the leadframe.

Figure 4:
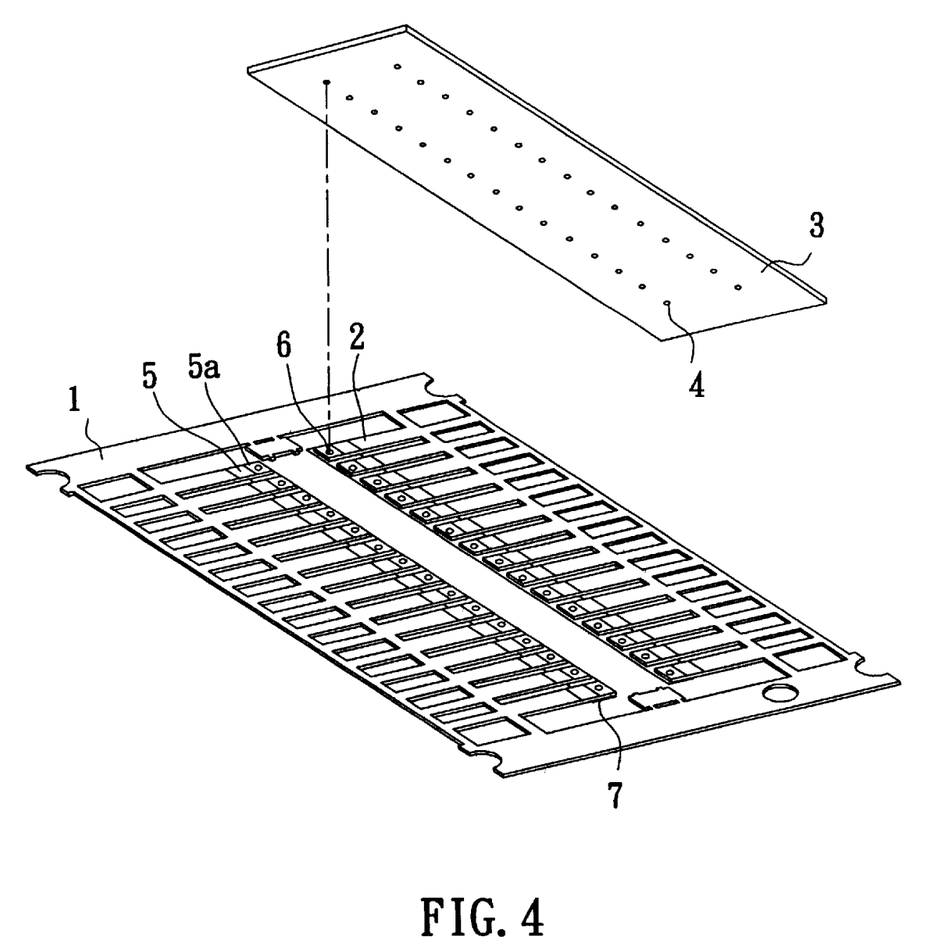
FIG. 4 is a view showing a first preferred embodiment of the packaging method of the present invention.

FIG. 4 shows a first embodiment of the present invention. A solder-attachable metal layer 5 is disposed at each lead finger 2 of the leadframe 1. In addition, an adhesive tape 7 is adhered to the bottoms of the lead fingers 2 for improving the coplanarity of the lead fingers 2. Moreover, the area with the solder-attachable metal layer 5 is painted with a solder-mask 5a (or other non-conductive material). Then, by means of etching (or other mechanical measure), the soldermask 5a is formed with orifices 6 at those positions where the lead fingers 2 will connect with the solder bumps 4. The orifices 6 can have circular shape or other shapes for exposing the solder-attachable metal layer 5 of the lead fingers 2. Then, the chip 3 is reversed, making the solder bumps 4 thereon accurately seated into the orifices 6. Then, by means of a reflowing heating procedure, the solder bumps 4 are secured on the lead fingers 2 of the leadframe.

Figure 5:
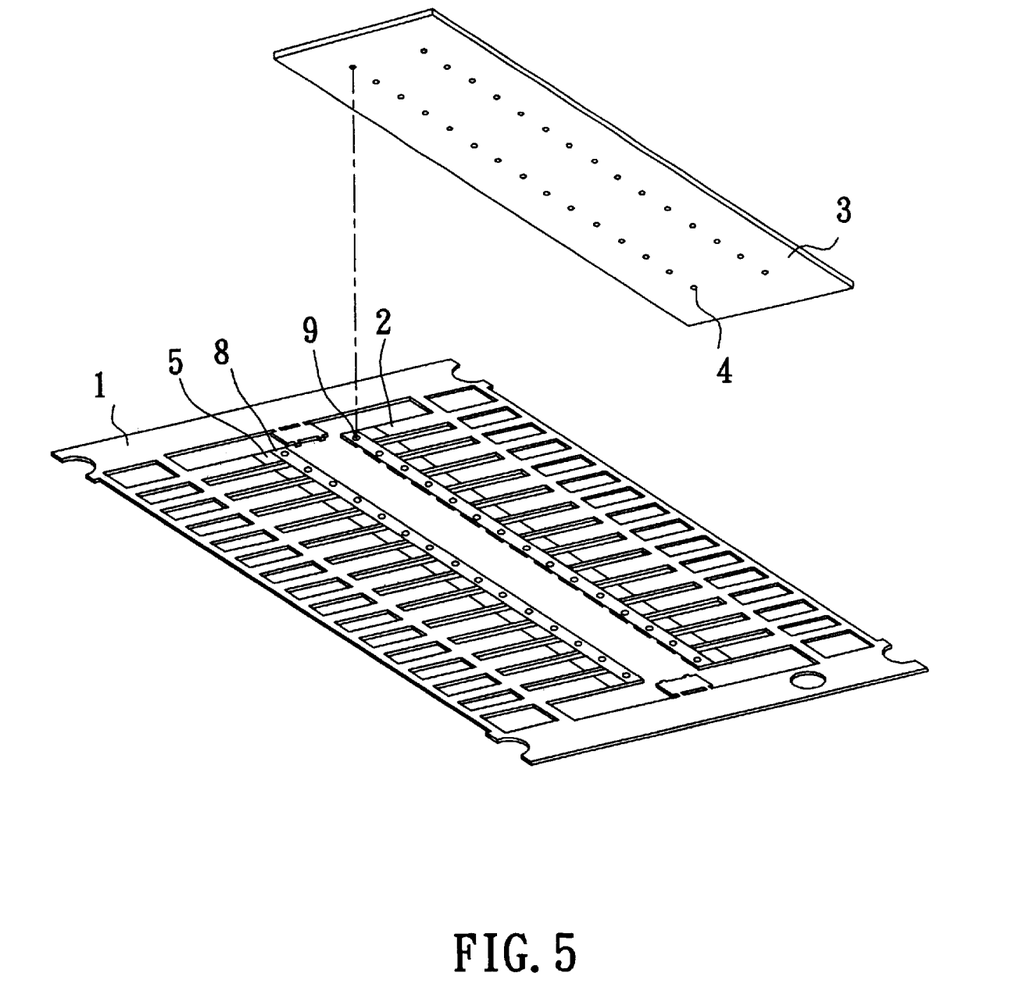
FIG. 5 is a view showing a second preferred embodiment of the packaging method of the present invention.

FIG. 5 shows a second embodiment of the present invention, in which the solder-attachable metal layer 5 is disposed on the lead fingers 2 of the leadframe 1. A non-conductive adhesive tape 8 which has single adhesive face is adhered to the surface of the metal layer 5. The non-conductive tape 8 is formed with orifices 9 at those positions where the lead fingers 2 will connect with the solder bumps 4. The orifices 9 can have circular shape or other shapes for exposing the solder-attachable metal layer 5 of the lead fingers 2. Moreover, the tape 8 is free from adhesion on both faces near the orifices 9. Then the chip is reversed to accurately seat the solder bumps 4 into the orifices 9. By means of a reflowing heating procedure, the solder bumps 4 are secured on the lead fingers 2 of the leadframe 1.

Figure 6:
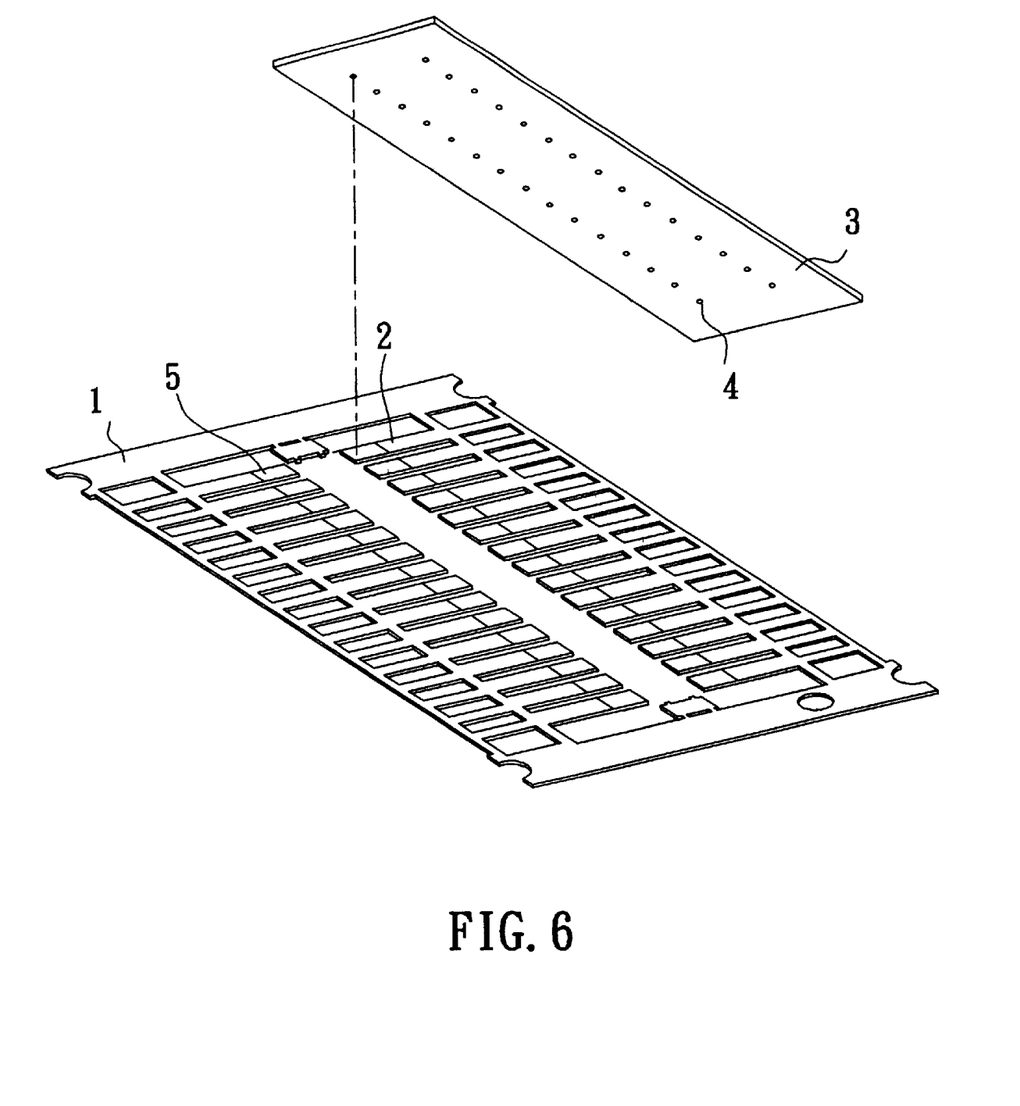
FIG. 6 is a view showing a third preferred embodiment of the packaging method of the present invention.
Figure 7:
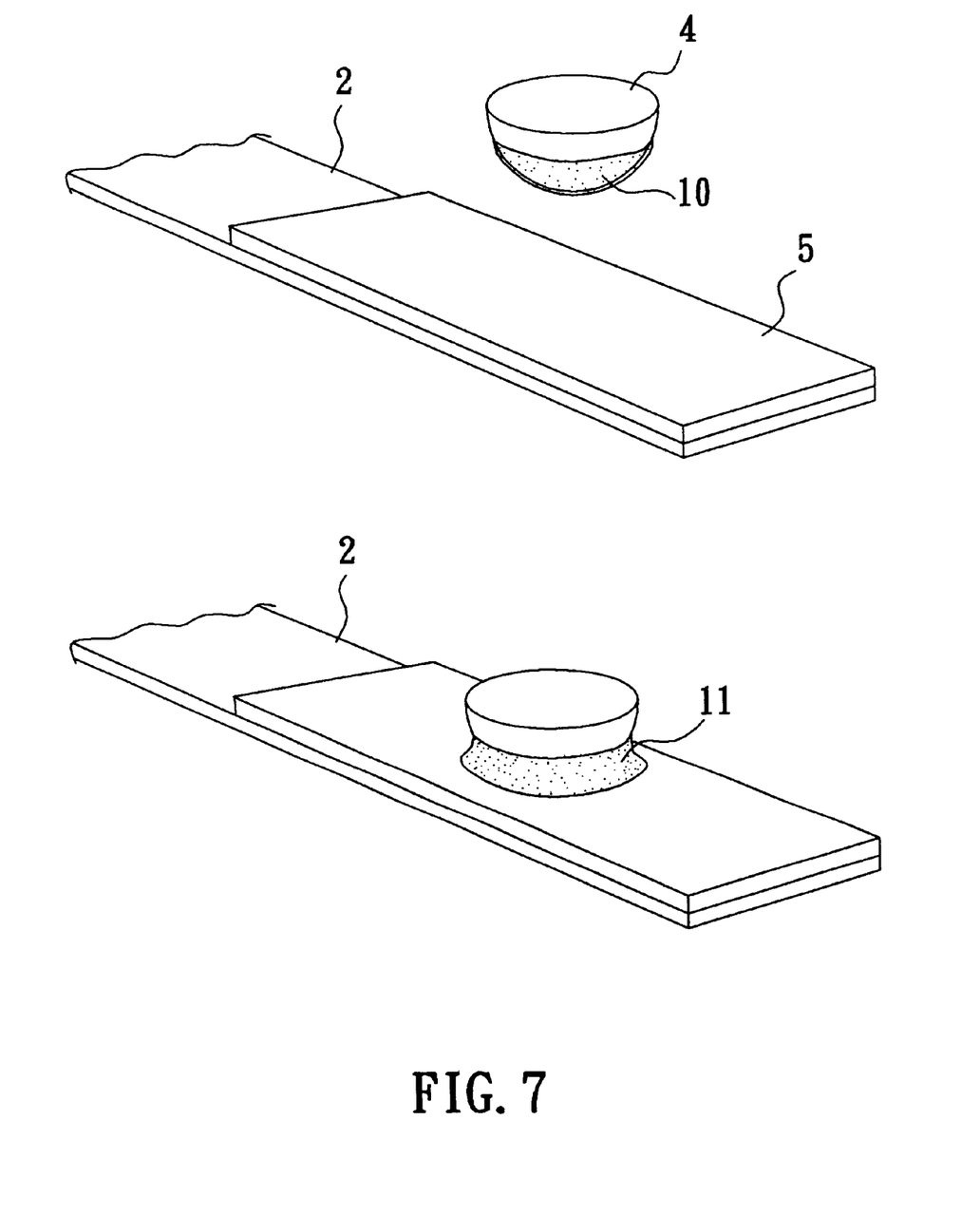
FIG. 7 is an enlarged view showing the fusion of FIG. 6.

FIG. 6 shows a third embodiment of the present invention, in which a solder-attachable metal layer 5 is disposed on each lead finger 2 of the leadframe 1. The metal layer 5 has a certain thickness and a melting point lower than that of the solder bump 4 shown in FIG. 7. The solder bump 4 as shown is coated with a flux 10. When connecting the solder bump 4 with the solder-attachable metal layer 5 on the lead finger 2, the metal layer 5 will be molten into a liquid which collects around the contacting position of the solder bump 4 with the metal layer 5 to form a fussion with a crater profile 11 as shown in FIG. 7. During the entire connecting procedure, the solder bump 4 will not melt and only the solder-attachable metal layer 5 will melt. The liquid metal layer fusion 5 will wet the spherical face of the solder bump 4 by a flowing way similar to the capillary. Finally, a crater profile 11 as shown in FIG. 7 is formed.

Figure 8A:
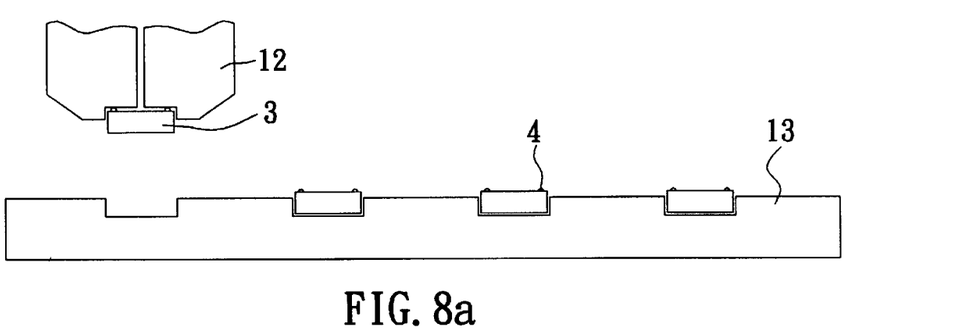
FIGS. 8a, 8b, 8c and 8d show the assembling procedure in the embodiment of FIG. 6.
Figure 8B:
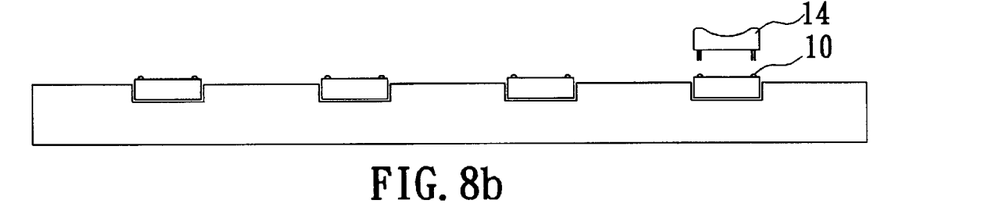
Figure 8C:
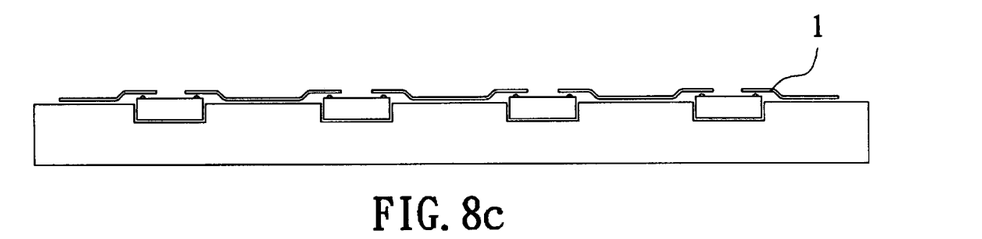
Figure 8D:
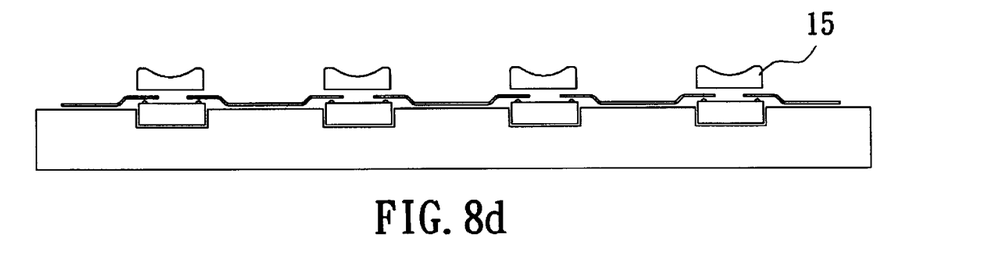

FIGS. 8a–8d show the assembly procedure in the embodiment of FIG. 6. First, a die-bond head 12 is used to place the chip 3 with the solder bump 4 on a clamp device 13 as shown in FIG. 8a. Then, in FIG. 8b, a needle 14 is used to paint a flux 4 onto the spherical face of the solder bump 4. Thereafter, as shown in FIG. 8c, the leadframe 1 is such positioned as to align the solder-attachable metal layer 5 of the lead fingers with the solder bump 4. Finally, in FIG. 8d, a heating head 15 is used to apply a certain pressure and temperature to connect the solder bumps 4 with the solder-attachable metal layer 5. Such assembly procedure has two advantages: One, the problem of coplanarity of the lead fingers is solved, and two, the temperature control can be easily achieved to only melt the metal layer 5 without melting the solder bump 4 by conducting heat directly through the lead fingers to the solder-attachable metal layer 5.

Although the above embodiments have illustrated the present invention, it should be understood that such embodiments are not intended to limit the scope thereof. Many modifications of the above embodiments can be made without departing from the spirit of the present invention as defined by the attached claims.

What is claimed is:

1. A packaging method for integrated circuit device, said integrated circuit device including a chip and a leadframe, a surface of the chip being disposed with multiple solder bumps for electrically connecting with external side, the leadframe having multiple lead fingers, said packaging method comprising steps of:

metallurgically processing certain sections of the lead fingers of the leadframe for carrying the chip so as to make the sections solder-attachable;

respectively aligning the solder-attachable sections of the lead fingers of the leadframe with the solder bumps of the chip; and through heating and pressurizing processing, respectively fixedly connecting the solder-attachable sections of the lead fingers of the leadframe with the solder bumps of the chip, and wherein the metallurgically Processing step of the lead fingers further comprising the steps of:

disposing an insulating material layer on the solder-attachable sections of the lead fingers of the leadframe; and forming orifices at certain positions of the insulating material layer for exposing the solder-attachable sections of the lead fingers.

2. A packaging method as claimed in claim 1, wherein the orifices can have a circular shape or other shapes.

3. A packaging method as claimed in claim 1, further comprising the steps of:

adhering a non-conductive adhesive tape onto an opposite side of the solder-attachable sections of the lead fingers of the leadframe, the adhesive tape being adhered to at least two lead fingers.

4. A packaging method as claimed in claim 1, wherein the metallurgically processing step of the lead fingers further comprising the step of:

adhering a non-conductive adhesive tape onto the solder-attachable sections of the lead fingers of the leadframe, the adhesive tape being adhered to at least two lead fingers, and the adhesive tape having orifices formed at certain positions of the solder-attachable sections of the lead fingers for exposing the solder-attachable sections of the lead fingers.

5. A packaging method as claimed in claim 4, wherein the orifices can have a circular shape or other shapes.

6. A packaging method as claimed in claim 4, wherein only one face of the tape is adhesive.

7. A packaging method as claimed in claim 6, wherein the tape is free from adhesive material on both faces near the orifices for exposing the solder attachable sections.

8. A packaging method as claimed in claim 1, wherein the metallurgically processing step of the lead fingers serves to form a solder-attachable metal layer with a certain thickness on sections of the lead fingers for carrying the chip, said certain thickness being sufficient for said metal layer to form a connection with said solder bumps of the chip.

9. A packaging method as claimed in claim 8, wherein the metal layer has a melting point lower than that of the solder bumps of the chip.

10. A packaging method as claimed in claim 8, wherein the metallurgically processing step of the lead fingers further comprising the step of painting a flux onto the solder bumps.

11. A packaging method for integrated circuit device, said integrated circuit device including a chip and a leadframe, a surface of the chip being disposed with multiple solder bumps for electrically connecting with external side, the leadframe having multiple lead fingers, said packaging method comprising steps of:

metallurgically processing certain sections of the lead fingers of the leadframe for carrying the chip so as to make the sections solder-attachable;

respectively aligning the solder-attachable sections of the lead fingers of the leadframe with the solder bumps of the chip; and through heating and pressurizing processing, respectively fixedly connecting the solder-attachable sections of the lead fingers of the leadframe with the solder bumps of the chip.

\* \* \* \* \*